United States Patent
Min et al.

(10) Patent No.: US 8,354,350 B2
(45) Date of Patent: Jan. 15, 2013

(54) TEMPLATE DERIVATIVE FOR FORMING ULTRA-LOW DIELECTRIC LAYER AND METHOD OF FORMING ULTRA-LOW DIELECTRIC LAYER USING THE SAME

(75) Inventors: Sung Kyu Min, Seoul (KR); Ja Chun Ku, Gyeonggi-do (KR); Sang Tae Ahn, Gyeonggi-do (KR); Chai O Chung, Gyeonggi-do (KR); Hyeon Ju An, Gyeonggi-do (KR); Hyo Seok Lee, Gyeonggi-do (KR); Eun Jeong Kim, Gyeonggi-do (KR); Chan Bae Kim, Seoul (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 13/475,178

(22) Filed: May 18, 2012

(65) Prior Publication Data

US 2012/0231634 A1 Sep. 13, 2012

Related U.S. Application Data

(62) Division of application No. 11/964,950, filed on Dec. 27, 2007, now Pat. No. 8,202,807.

(30) Foreign Application Priority Data

Dec. 27, 2006 (KR) .................. 10-2006-0135737
Apr. 30, 2007 (KR) .................. 10-2007-0042106

(51) Int. Cl.
*H01L 21/31* (2006.01)

(52) U.S. Cl. ...... 438/781; 536/103; 528/9; 257/E21.492
(58) Field of Classification Search .................. 438/781; 536/103; 257/E21.492; 528/9
See application file for complete search history.

(56) References Cited

U.S. PATENT DOCUMENTS

2005/0233583 A1 10/2005 Miyajima
2006/0069171 A1 3/2006 Prokopowicz et al.

FOREIGN PATENT DOCUMENTS

KR 1020060117563 A 11/2006

OTHER PUBLICATIONS

Jae Jin Shin, et al; "Chemically Reactive Nanoparticle for Ultra-low k Applications", Mol. Cryst. Liq. Cryst., vol. 445, pp. 157[457]-175[465], 2006: ISSN: 1542-1406 print/1563-5287 online; DOI: 10.1080/15421400500367074.

Joseph B. Lambert, et al; "Solid Phase Host-Guest Properties of Cyclodextrins and Calixarenes Covalently Attached to a Polysilsesquioxane Matrix", Chem. Mater. Jan. 14, 2003, vol. 15, Issue 1, pp. 131-145.

USPTO NFOA mailed Aug. 11, 2009 in connection with U.S. Appl. No. 11/964,950.

(Continued)

Primary Examiner — Shane Fang
(74) Attorney, Agent, or Firm — Ladas & Parry LLP

(57) ABSTRACT

A reactive cyclodextrin derivative or a reactive glucose derivative is used as a template derivative for forming an ultra-low dielectric layer. A layer is formed of the reactive cyclodextrin derivative or the reactive glucose derivative capped with Si—H and then cured in an atmosphere of hydrogen peroxide to form the ultra-low dielectric layer.

7 Claims, 3 Drawing Sheets

R:H

Allylation
(Ally bromide)
⟶
hydrosilyation
(Trialkoxysilane)

$R'_2(CH_2)n-SiH_3$

OTHER PUBLICATIONS

USPTO NFOA mailed Oct. 13, 2009 in connection with U.S. Appl. No. 11/964,950.
USPTO NFOA mailed Mar. 30, 2010 in connection with U.S. Appl. No. 11/964,950.
USPTO FOA mailed Aug. 26, 2010 in connection with U.S. Appl. No. 11/964,950.
USPTO NFOA mailed Sep. 15, 2011 in connection with U.S. Appl. No. 11/964,950.
USPTO NOA mailed Mar. 14, 2012 in connection with U.S. Appl. No. 11/964,950.

R:$(CH_2)n-SiH_3$ (n=1~3)

TEMPLATE DERIVATIVE FOR FORMING ULTRA-LOW DIELECTRIC LAYER AND METHOD OF FORMING ULTRA-LOW DIELECTRIC LAYER USING THE SAME

CROSS-REFERENCE TO RELATED APPLICATIONS

The present application claims priority to Korean patent application numbers 10-2006-0135737 filed on Dec. 27, 2006 and 10-2007-0042106 filed on Apr. 30, 2007 and to U.S. Pat. No. 8,202,807 filed Dec. 27, 2007, which are incorporated herein by reference in their entirety. The present application claims priority to U.S. Pat. No. 8,202,807 filed Dec. 27, 2007.

BACKGROUND OF THE INVENTION

The present invention relates to a template derivative for forming an ultra-low dielectric layer, and a method of forming the ultra-low dielectric layer using the same, and more particularly, to a template derivative for forming an ultra-low dielectric layer which is capable of forming an ultra-low dielectric layer with superior mechanical strength, and a method of forming the ultra-low dielectric layer using the same.

With the requirement for high integration and high speed for semiconductor devices, the line width of metal wiring and the space between the metal wirings have been rapidly reduced over time. Particularly, with the reduction in the distance between the metal wirings, this causes an increased parasitic capacitance between the metal wirings under the interposition of an insulation layer.

Therefore, various process technologies for lowering the resistance of the metal wiring and reducing the parasitic capacitance have been studied. As part of the technology, there have been attempts to use low resistance materials, such as copper (Cu) instead of existing aluminum (Al), as the metal wiring material, and to use a low dielectric material having a dielectric constant k of approximately 3.0, instead of $SiO_2$ having the dielectric constant k of 4.0, or fluorinated silicon glass having the dielectric constant k of 3.5, as an insulation layer material formed between the metal wirings.

Also recently, studies of ultra-low dielectric layers having a dielectric constant k of 2.2 to 2.5 are actively in progress. In relation to this, there has been an attempt for a nanotemplating method in which a thermally unstable pore generating resin, such as a porogen, is used as a nanotemplate and dispersed into an inorganic matrix, and then pores are introduced into the inorganic matrix through a high temperature heat treatment to form an ultra-low dielectric layer. At this time, it is important that the matrix containing pores should have superior mechanical and dielectric characteristics and, at the same time, the pore should have a very small size and a low connectivity.

Meanwhile, the ultra-low dielectric layer may be deposited through a chemical vapor deposition (CVD) process or a spin coating process.

In the use of the CVD process, a silicon based monomer containing a non-reactive porogen is deposited alone, or the non-reactive porogen and a matrix are co-deposited together to form the ultra-low dielectric layer. However, because the use of the CVD process is not accompanied with a chemical bonding of the two materials, i.e. the non-reactive porogen and the matrix, the use of the CVD process has the problem that it is impossible to inhibit clumping of the non-reactive porogen.

The use of the spin coating process is better than the use of the CVD process to lower the dielectric constant. However, the use of the spin coating process is problematic in that it is difficult to control pore morphology, and particularly the pores are connected with one another when the pore content exceeds 20%, and also the mechanical strength is rapidly reduced with an increase in the pore content.

Therefore, a method of forming the ultra-low dielectric layer using a reactive porogen such as cyclodextrin derivative is desired.

FIG. 1 is a view illustrating a cyclodextrin derivative.

As shown, the cyclodextrin derivative is formed using cyclodextrin as a precursor and through an allylation reaction using allylbromide and a hydrosilylation reaction using trialkoxysilane, and has a structure capped with the trialkoxysilane.

In FIG. 1, a reaction group R represents H, and R' represents $(CH_2)_n$—$SiH_3$.

Since this reactive porogen can undergo a sol-gel reaction with an organic silicate matrix precursor unlike the existing non-reactive porogen, such as poly-carprolactone and poly-methylmethacrylate, the ultra-low dielectric layer formed using this reactive porogen has advantages that it is superior not only in the aspect of the pore morphology but also in the aspect of the mechanical strength.

However, since the reactive porogen, such as cyclodextrin, has very low reactivity with the matrix, compared to the reactivity of the matrix itself, a clumping of the reactive porogen is generated when the porogen content is more than a specific amount, and thus the pore morphology problem cannot be solved. Particularly, when the porogen content is high, the pore size and the pore connectivity are increased and thus it is impossible to obtain the desired ultra-low dielectric layer.

Also, even in the ultra-low dielectric layer formed using the reactive porogen, such as cyclodextrin, the pore size rapidly increases resulting in the rapid decrease in the mechanical strength when the dielectric constant is uniformly and continuously lowered. Particularly, a curing process using ultraviolet rays should be followed to solve this problem, which makes the process more complicated.

SUMMARY OF THE INVENTION

Embodiments of the present invention are directed to a template derivative for forming an ultra-low dielectric layer capable of solving the pore morphology problem, and a method of forming the ultra-low dielectric layer using the same.

Also, embodiments of the present invention are directed to a template derivative for forming an ultra-low dielectric layer capable of forming an ultra-low dielectric layer with superior mechanical strength, and a method of forming an ultra-low dielectric layer using the same.

In one embodiment, a template derivative for forming an ultra-low dielectric layer is composed of a cyclodextrin derivative represented by the following formula 1:

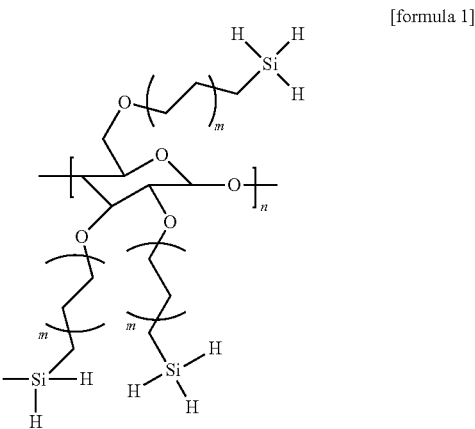

[formula 1]

wherein, in the formula 1, n is an integer of 6 to 8 and m represents an integer of 1 to 3.

The cyclodextrin derivative is formed through an allylation of a reactive cyclodextrin using allylbromide and a following hydrosilylation of the allylated reactive cyclodextrin with SiH$_4$ gas.

The cyclodextrin derivative is capped with Si—H.

The cyclodextrin derivative is selected from hexakis{2,3,6-tri-O-(3-trihydrosilylpropyl)-α-cyclodextrin}, heptakis{2,3,6-tri-O-(3-trihydrosilylpropyl)-β-cyclodextrin} and octakis{2,3,6-tri-O-(3-trihydrosilylpropyl)-γ-cyclodextrin}.

In one embodiment, a method of forming an ultra-low dielectric layer comprises forming a layer using the cyclodextrin derivative represented by the above formula 1; and curing the formed layer using the cyclodextrin derivative in an atmosphere of hydrogen peroxide.

The step of forming the layer using the cyclodextrin derivative is performed using the cyclodextrin derivative together with a silicate low dielectric matrix.

The silicate low dielectric matrix includes one silicate precursor selected from polymethylsilsesquioxane and polymethylsilsesquioxane copolymer.

The step of forming the layer using the cyclodextrin derivative is performed in a spin-on method.

The step of curing the layer formed using the cyclodextrin derivative in an atmosphere of hydrogen peroxide is performed at a temperature of 100 to 250° C. for 30 to 120 minutes.

The method may further comprise, after the step of curing the layer formed using the cyclodextrin derivative in an atmosphere of hydrogen peroxide, the step of heat treating the cured layer.

The step of heat treating the cured layer is performed at a temperature of 350 to 400° C. for 30 to 120 minutes.

In another embodiment, a template derivative for forming an ultra-low dielectric layer is composed of a glucose derivative represented by the following formula 2:

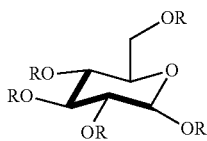

[Formula 2]

wherein, in formula 2, R represents (CH$_2$)$_n$—SiH$_3$ and n represents an integer of 1 to 3.

The glucose derivative is formed through an allylation of a reactive glucose precursor using allylbromide and a following hydrosilylation of the allylated reactive glucose precursor with SiH$_4$ gas.

The glucose derivative is capped with Si—H.

In another embodiment, a method of forming an ultra-low dielectric layer comprises forming a layer using the glucose derivative represented by the above formula 2; and curing the layer in an atmosphere of hydrogen peroxide.

The step of forming the layer using the glucose derivative is performed using the glucose derivative alone or together with a silicate low dielectric matrix.

The silicate low dielectric matrix includes one silicate precursor selected from polymethylsilsesquioxane and polymethylsilsesquioxane copolymer.

The step of forming the layer using the glucose derivative is performed in a spin-on method.

The curing step is performed at a temperature of 100 to 250° C. for 30 to 120 minutes.

The method may further comprise, after the step of curing the layer formed using the glucose derivative in an atmosphere of hydrogen peroxide, the step of heat treating the cured layer.

The heat treatment is performed at a temperature of 350 to 400° C. for 30 to 120 minutes.

DESCRIPTION OF SPECIFIC EMBODIMENTS

In a preferred embodiment of the present invention, a layer is formed using a cyclodextrin derivative capped with Si—H as a template derivative for forming an ultra-low dielectric layer, and then cured in an atmosphere of hydrogen peroxide to form the ultra-low dielectric layer. At this time, the layer formed using the cyclodextrin derivative is formed using the cyclodextrin derivative alone or together with a silicate low dielectric matrix.

In this case, a sol-gel reaction is generated in which Si—H bonding in a sol state of the cyclodextrin derivative is changed into Si—OH bonding in a sol state, and then the Si—OH bonding in a sol state is changed into Si—OH bonding in a gel state through a curing treatment in an atmosphere of hydrogen peroxide. At this time, the reactivity of the Si—OH with the silicate low dielectric matrix is much superior to the reactivity of the Si—OR (R: methyl or ethyl) of a conventional reactive porogen with the silicate low dielectric matrix.

Therefore, in the present invention, since the porogen, having a size of several nanometers, can be dispersed independently into the silicate low dielectric matrix even when the porogen content is high, it is possible to form the ultra-low dielectric layer having superior mechanical and dielectric characteristics and, at the same time, having pores with a very small size and a low connectivity.

Also, in another preferred embodiment of the present invention, a layer is formed using, as a template derivative for forming an ultra-low dielectric layer, a glucose derivative capped with Si—H alone or together with the conventional silicate low dielectric matrix and then cured in an atmosphere of hydrogen peroxide to form the ultra-low dielectric layer.

In this case, like the aforementioned case, a sol-gel reaction is generated in which Si—H bonding in a sol state of the glucose derivative is changed into Si—OH bonding in a gel state through the curing treatment in the atmosphere of hydrogen peroxide. At this time, the reactivity of the Si—OH with the silicate low dielectric matrix is much superior to the reactivity of the Si—OR (R: methyl or ethyl) of the conventional reactive porogen with a silicate low dielectric matrix.

Therefore, in the present invention, since the porogen, having a size of several nanometers, can be dispersed independently into the silicate low dielectric matrix, even when the porogen content is high and the pore has a small size of less than 1 nm and low connectivity due to the small size of the glucose particle, it is possible to form the ultra-low dielectric layer having superior mechanical strength, and no follow-up UV treatment is needed.

Hereafter, preferred embodiments of the present invention are described in detail with reference to the accompanying drawings.

Figure 1:
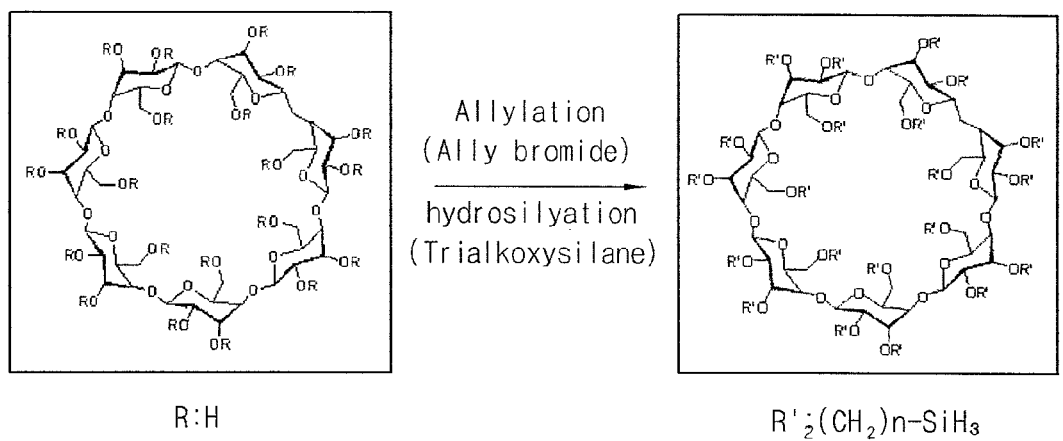
FIG. 1 is a view illustrating a cyclodextrin derivative.
Figure 2:
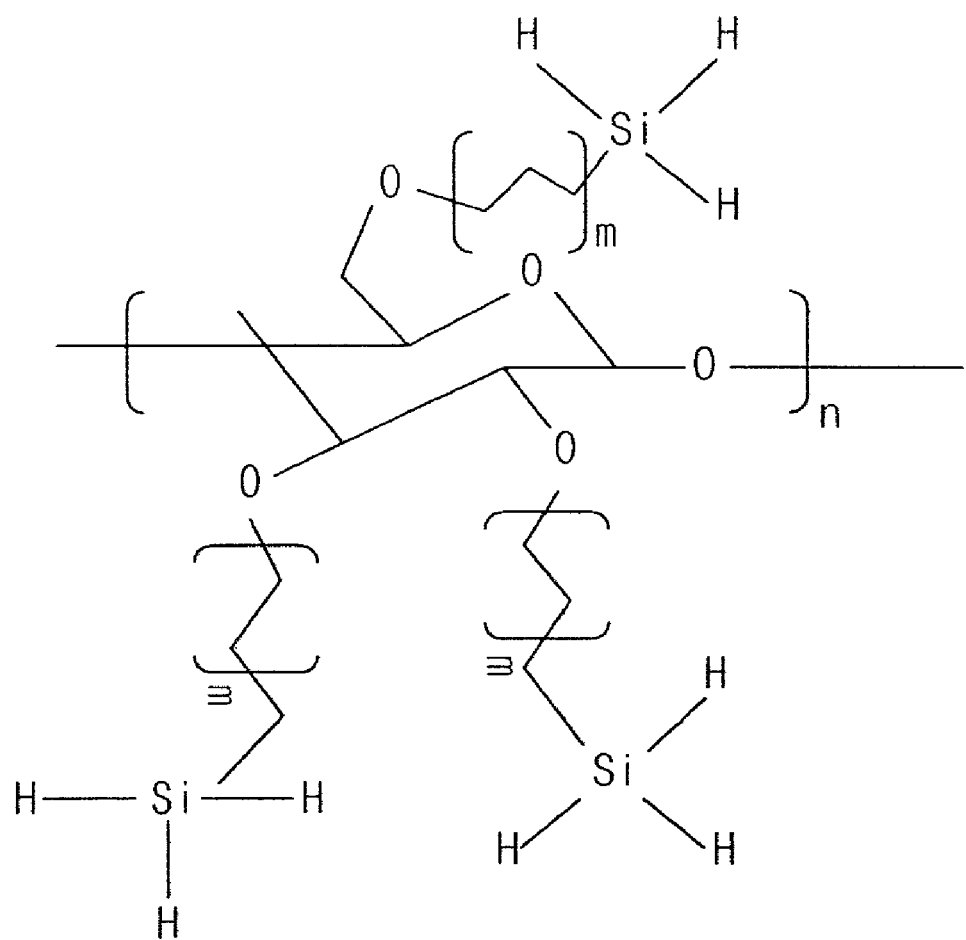
FIG. 2 shows a chemical formula for a reactive cyclodextrin derivative in accordance with an embodiment of the present invention.

FIG. 2 shows the chemical formula of a reactive cyclodextrin derivative in accordance with an embodiment of the present invention.

As shown, a template derivative for forming an ultra-low dielectric layer in accordance with an embodiment of the present invention is a cyclodextrin derivative capped with Si—H. The cyclodextrin derivative is formed using a reactive cyclodextrin as a precursor and through an allylation of the reactive cyclodextrin using allylbromide and a following hydrosilylation in which the allylated reactive cyclodextrin is reacted with $SiH_4$ gas. Examples of the cyclodextrin derivative may include hexakis{2,3,6-tri-O-(3-trihydrosilylpropyl)-α-cyclodextrin}, heptakis{2,3,6-tri-O-(3-trihydrosilylpropyl)-β-cyclodextrin} and octakis{2,3,6-tri-O-(3-trihydrosilylpropyl)-γ-cyclodextrin}.

In FIG. 2, n is an integer of 6 to 8 and m is an integer of 1 to 3.

A method of forming an ultra-low dielectric layer in accordance with an embodiment of the present invention using the reactive cyclodextrin derivative is as follows.

Firstly, a thin layer is formed over a semiconductor substrate using the reactive cyclodextrin derivative according to a spin-on method. At this time, the thin layer is formed using the cyclodextrin derivative alone or together with a silicate low dielectric matrix. The silicate low dielectric matrix includes one silicate precursor of polymethylsilsesquioxane and polymethylsilsesquioxane copolymer.

Next, the thin layer formed of the reactive cyclodextrin derivative is subjected to a curing treatment in an atmosphere of hydrogen peroxide. The curing treatment is performed at a temperature of 100 to 250° C. for 30 to 120 minutes. During the curing treatment, a sol-gel reaction is generated in which Si—H bonding in a sol state, which has capped the cyclodextrin derivative, is changed into Si—OH bonding in a sol state, and then the Si—OH bonding in a sol state is changed into Si—OH bonding in a gel state. At this time, the reactivity of the Si—OH with the silicate low dielectric matrix is much superior to the reactivity of the Si—OR of the conventional reactive porogen with the silicate low dielectric matrix.

Therefore, if the ultra-low dielectric layer is formed using the reactive cyclodextrin derivative in accordance with an embodiment of the present invention, since the porogen having a size of several nanometers can be dispersed independently into the silicate low dielectric matrix even when the porogen content is high, it is possible to form the ultra-low dielectric layer having superior mechanical and dielectric characteristics and, at the same time, having a pore with a very small size and a low connectivity.

Subsequently, the cured thin layer is heat treated at a temperature of 350 to 400° C. for 30 to 120 minutes to form the ultra-low dielectric layer in accordance with an embodiment of the present invention.

As described above, in an embodiment of the present invention, since a layer is formed using the reactive cyclodextrin derivative capped with Si—H bonding and then subjected to a curing treatment in an atmosphere of hydrogen peroxide to form the ultra-low dielectric layer, it is possible to enhance the mechanical and dielectric characteristics of the ultra-low dielectric layer and reduce size and connectivity of the pore in the ultra-low dielectric layer.

Figure 3:
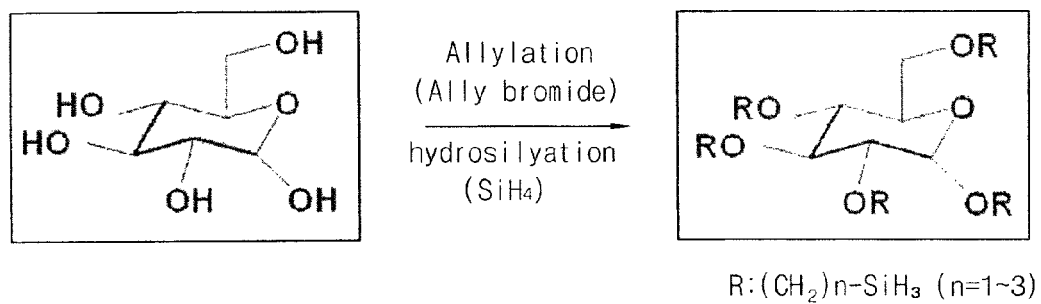
FIG. 3 shows a chemical formula for a glucose derivative in accordance with another embodiment of the present invention.

FIG. 3 shows a chemical formula of a glucose derivative in accordance with another embodiment of the present invention.

As shown, a template derivative for forming an ultra-low dielectric layer in accordance with another embodiment of the present invention is a reactive glucose derivative capped with Si—H. The reactive glucose derivative capped with Si—H is formed through an allylation reaction of a glucose precursor using allylbromide and a following hydrosilylation reaction of the allylated glucose precursor using $SiH_4$ gas.

In FIG. 3, a reaction group R represents $(CH_2)_n$—SiH3 and n is an integer of 1 to 3.

A method of forming an ultra-low dielectric layer in accordance with another embodiment of the present invention using the reactive glucose derivative is as follows.

A thin layer is formed over a semiconductor substrate using the reactive glucose derivative according to a spin-on method. At this time, the thin layer is formed using the glucose derivative alone or together with a conventional silicate low dielectric matrix. The silicate low dielectric matrix includes one silicate precursor of polymethylsilsesquioxane and polymethylsilsesquioxane copolymer.

Next, the thin layer formed of the glucose derivative is subjected to a curing treatment at a temperature of 100 to 250° C. for 30 to 120 minutes in an atmosphere of hydrogen peroxide. During the curing treatment, a sol-gel reaction is generated in which Si—H bonding in a sol state which has capped the glucose derivative is changed into Si—OH bonding in a sol state, and then the Si—OH bonding in a sol state is changed into Si—OH bonding in a gel state, and the Si—OH bonding has superior reactivity with the silicate low dielectric matrix compared to the conventional case.

Therefore, if the ultra-low dielectric layer is formed using the reactive glucose derivative, since the porogen having a size of several nanometers can be dispersed independently into the silicate low dielectric matrix even when a porogen content is high, it is possible to form the ultra-low dielectric layer having a low pore connectivity, a superior mechanical strength and a low dielectric constant.

Subsequently, the cured thin layer is heat treated at a temperature of 350 to 400° C. for 30 to 120 minutes to form the ultra-low dielectric layer using the reactive glucose derivative in accordance with another embodiment of the present invention.

As described above, in another embodiment of the present invention, since a layer is formed using the reactive glucose derivative capped with Si—H bonding and then subjected to a curing treatment in an atmosphere of hydrogen peroxide to form the ultra-low dielectric layer, it is possible to enhance the mechanical and dielectric characteristics of the ultra-low dielectric layer and reduce size and connectivity of the pore in the ultra-low dielectric layer.

Although specific embodiments of the present invention have been described for illustrative purposes, those skilled in the art will appreciate that various modifications, additions and substitutions are possible, without departing from the scope and the spirit of the invention is as disclosed in the accompanying claims.

What is claimed is:

1. A method of forming an ultra-low dielectric layer using a template derivative for forming ultra-low dielectric layer, comprising the steps of:

forming a layer using a cyclodextrin derivative represented by the following formula:

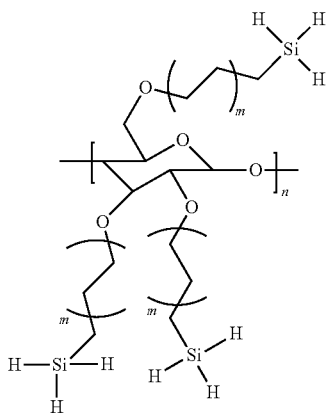

wherein, in the formula, n is an integer of 6 to 8 and m represents an integer of 1 to 3, and the cyclodextrin derivative is capped with Si—H; and curing the layer formed using the cyclodextrin derivative in an atmosphere of hydrogen peroxide.

2. The method according to claim 1, wherein the step of forming the layer using the cyclodextrin derivative is performed using the cyclodextrin derivative together with a silicate low dielectric matrix.

3. The method according to claim 2, wherein the silicate low dielectric matrix includes one silicate precursor selected from polymethylsilsesquioxane and polymethylsilsesquioxane copolymer.

4. The method according to claim 1, wherein the step of forming the layer using the cyclodextrin derivative is performed in a spin-on method.

5. The method according to claim 1, wherein the step of curing the layer formed using the cyclodextrin derivative in an atmosphere of hydrogen peroxide is performed at a temperature of 100 to 250° C. for 30 to 120 minutes.

6. The method according to claim 1, further comprising, after the step of curing the layer formed using the cyclodextrin derivative in an atmosphere of hydrogen peroxide, the step of heat treating the cured layer.

7. The method according to claim 6, wherein the step of heat treating the cured layer is performed at a temperature of 350 to 400° C. for 30 to 120 minutes.

* * * * *